(12) United States Patent
Borrel et al.

(10) Patent No.: US 10,768,229 B2
(45) Date of Patent: Sep. 8, 2020

(54) GLITCH DETECTION OF A DC VOLTAGE

(71) Applicant: STMicroelectronics (Rousset) SAS, Rousset (FR)

(72) Inventors: Nicolas Borrel, Martigues (FR); Jimmy Fort, Puyloubier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 117 days.

(21) Appl. No.: 16/059,793

(22) Filed: Aug. 9, 2018

(65) Prior Publication Data

US 2019/0086473 A1    Mar. 21, 2019

(30) Foreign Application Priority Data

Sep. 21, 2017  (FR) .................................... 17 58750

(51) Int. Cl.
| | | |
|---|---|---|
| *G01R 31/40* | (2020.01) | |
| *G01R 31/317* | (2006.01) | |
| *G01R 19/165* | (2006.01) | |
| *G06F 1/28* | (2006.01) | |
| *H02M 1/00* | (2006.01) | |

(52) U.S. Cl.
CPC ..... *G01R 31/31721* (2013.01); *G01R 19/165* (2013.01); *G01R 19/16552* (2013.01); *G01R 31/40* (2013.01); *G06F 1/28* (2013.01); *H02M 2001/0009* (2013.01)

(58) Field of Classification Search
CPC .................. G01R 31/40; G01R 31/317; G01R 31/31721; G01R 19/165; G01R 19/16552; G06F 1/28
See application file for complete search history.

(56) References Cited

U.S. PATENT DOCUMENTS

| | | | |
|---|---|---|---|
| 7,085,979 B2* | 8/2006 | Kim .................... | G06K 19/073 714/733 |
| 7,253,677 B1* | 8/2007 | Kuramochi ............ | G05F 3/205 327/535 |
| 2003/0226082 A1 | 12/2003 | Kim et al. | |
| 2012/0003760 A1 | 1/2012 | Lubicki et al. | |
| 2014/0266122 A1 | 9/2014 | Zhu et al. | |
| 2017/0102418 A1 | 4/2017 | Tumati et al. | |
| 2017/0115359 A1 | 4/2017 | Leduc et al. | |

FOREIGN PATENT DOCUMENTS

| | | |
|---|---|---|
| FR | 3042876 A1 | 4/2017 |
| WO | 2014190666 A1 | 12/2014 |

\* cited by examiner

*Primary Examiner* — Minh N Tang

(74) *Attorney, Agent, or Firm* — Slater Matsil, LLP

(57) ABSTRACT

A circuit for detecting a glitch in power supply includes a detection circuit to detect the glitch in a DC supply voltage of the power supply when a magnitude in the glitch in a DC supply voltage of the power supply exceeds a detection threshold, wherein the detection threshold is a function of the DC supply voltage, and wherein the detection circuit comprises a low pass filter, a control circuit coupled to the low pass filter, and a current mirror circuit coupled to the control circuit having an output for providing a logic signal indicative of a detected glitch.

24 Claims, 3 Drawing Sheets

GLITCH DETECTION OF A DC VOLTAGE

CROSS-REFERENCE TO RELATED APPLICATIONS

This application claims priority to French Patent Application No. 1758750, filed on Sep. 21, 2017, which application is hereby incorporated herein by reference.

TECHNICAL FIELD

The present disclosure generally relates to electronic circuits, and more particularly to the detection of glitches of a DC voltage.

BACKGROUND

A glitch of a DC voltage of a circuit, particularly of the power supply voltage thereof, may cause a malfunctioning of the circuit. In particular, when the circuit comprises confidential data, the glitch may be intentionally caused by a pirate who attempts to access the confidential data.

To prevent circuit malfunctions resulting from glitches on their power supply voltages, certain circuits are equipped with countermeasures.

SUMMARY

Thus, an embodiment overcomes at least certain disadvantages of existing circuits of detection of glitches of a DC voltage, particularly of a power supply voltage.

An embodiment provides a circuit for detecting a glitch of a DC voltage, wherein a detection threshold is a function of said DC voltage.

According to an embodiment, the threshold varies proportionally to a voltage obtained by low-pass filtering of said DC voltage.

According to an embodiment, a first current varying proportionally to said voltage obtained by filtering conditions the detection threshold.

According to an embodiment, the detection circuit comprises, between a first terminal and a second terminal of application of said DC voltage, a low-pass filter configured to supply said voltage obtained by filtering.

According to an embodiment, the detection circuit further comprises, in series between the first terminal and the second terminal: a first branch comprising a first transistor and a first current source; a second branch comprising a resistive element, a second transistor mirror-assembled with the first transistor, and a second current source supplying the first current.

According to an embodiment, the detection circuit further comprises: a third transistor, the second current source comprising a fourth transistor mirror-assembled with the third transistor; and a control circuit configured to supply the third transistor with a second current varying proportionally to said voltage obtained by filtering.

According to an embodiment, the first current source comprises a fifth transistor mirror-assembled with the third transistor.

According to an embodiment, the control circuit comprises another resistive element and is further configured to impose said voltage obtained by filtering across said other resistive element, the second current varying proportionally to a third current running through said other resistive element.

According to an embodiment, the control circuit comprises: a sixth transistor in series with the third transistor between the first terminal and the second terminal; and a seventh transistor in series with said other resistive element between the first terminal and the second terminal, a control terminal of the seventh transistor being coupled to a control terminal of the sixth transistor.

According to an embodiment, the control circuit comprises an operational amplifier having a first input connected to an output of the low-pass filter, having a second input connected to the junction point of the seventh transistor and of said other resistive element, and having an output connected to the control terminals of the sixth and seventh transistors.

According to an embodiment, the first input of the amplifier is the inverting input and the second input of the amplifier is the non-inverting input.

According to an embodiment, the detection circuit comprises another low-pass filter connected to a control terminal of each of the first and second transistors.

According to an embodiment, the detection circuit comprises another low-pass filter coupling the first terminal to said resistive element.

According to an embodiment, the transistors are MOS transistors.

According to an embodiment, the transistors are bipolar transistors.

The foregoing and other features and advantages will be discussed in detail in the following non-limiting description of specific embodiments in connection with the accompanying drawings.

BRIEF DESCRIPTION OF THE DRAWINGS

FIG. 3 also shows a capacitor C8 coupled between VCC and the gate of transistor 27, a resistor R8 coupled between the gate of transistor 27 and the gate of transistor 25, and a capacitor C7 in parallel with resistor R7.

DETAILED DESCRIPTION OF ILLUSTRATIVE EMBODIMENTS

Figure 1:
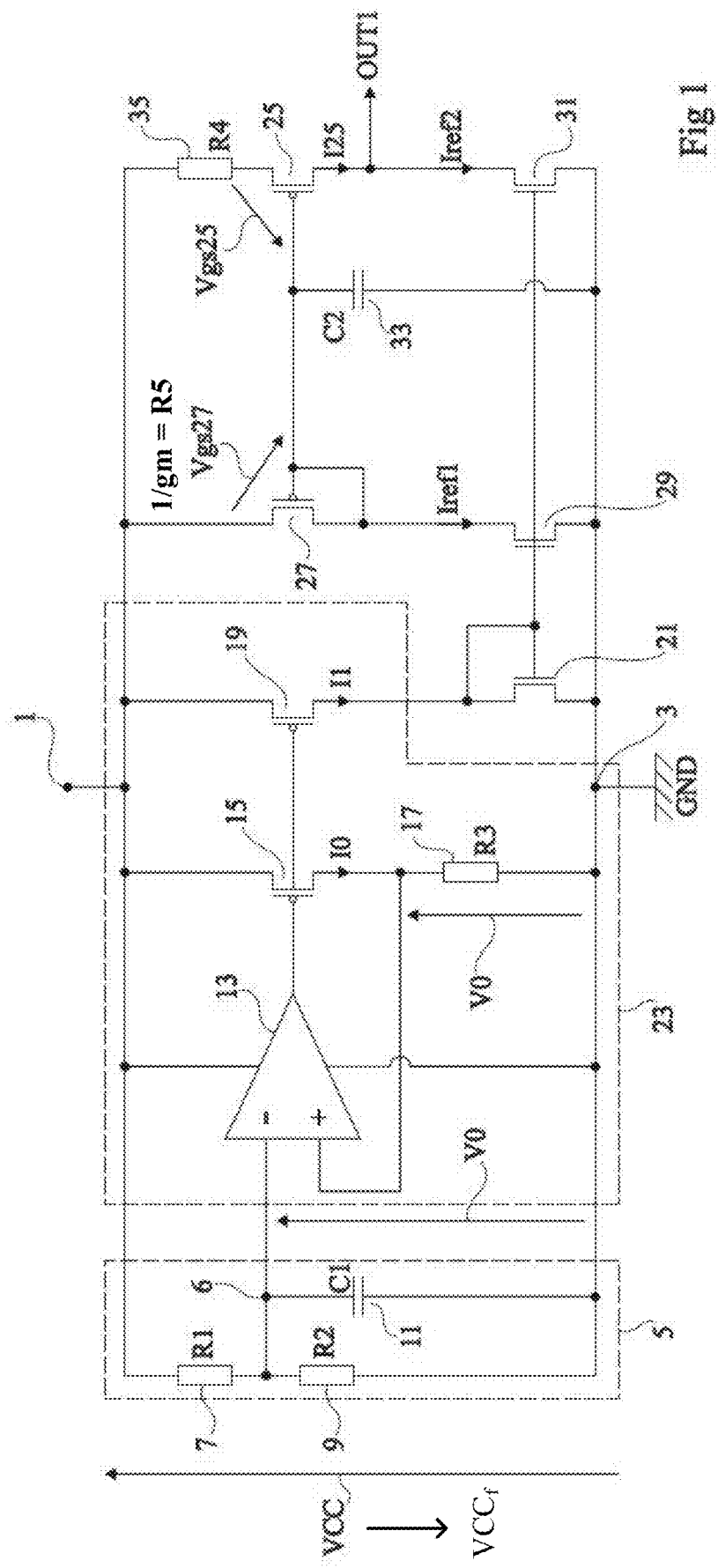
FIG. 1 shows an embodiment of a circuit for detecting positive glitches of a DC voltage.

The same elements have been designated with the same reference numerals in the various drawings and, further, the various drawings are not to scale. For clarity, only those steps and elements which are useful to the understanding of the described embodiments have been shown and are detailed. In particular, the electronic circuits where a glitch detection circuit may be provided have not been described, the described embodiments being compatible with the usual operation of such electronic circuits. Further, the countermeasures implemented during a detection of a DC voltage glitch have not been described, the described embodiments being compatible with usual countermeasures.

In the following description, unless otherwise specified, expressions "approximately", "substantially", and "in the order of" mean to within 10%, preferably to within 5%.

Unless otherwise specified, when reference is made to two elements connected together, this means directly connected with no intermediate element other than conductors, and when reference is made to two elements coupled together, this means that the two elements may be directly coupled (connected) or coupled via one or a plurality of other elements.

FIG. 1 shows an embodiment of a circuit for detecting positive glitches of a DC voltage.

The circuit is intended to receive, between a terminal 1 of application of a potential, for example, positive with respect to ground GND, and a terminal 3 of connection to ground GND, a DC voltage VCC where glitches are likely to appear.

A low-pass filter 5 is connected between terminals 1 and 3. Filter 5 supplies, based on voltage VCC, a filtered voltage V0 between an output terminal 6 of the filter and terminal 3. More particularly, voltage V0 is substantially proportional to a voltage $VCC_f$ equal to voltage VCC, where frequency disturbances greater than the cut-off frequency of low-pass filter 5 have been suppressed by filtering. In this embodiment, filter 5 comprises a voltage dividing bridge comprising, in series between terminals 1 and 3, a resistor 7 of value R1 and a resistor 9 of value R2, as well as a capacitor 11 of value C1 having a terminal connected to terminal 3 and having its other terminal, corresponding to output terminal 6 of filter 5, connected to the junction point of resistors 7 and 9. Voltage V0 is, in this example, substantially equal to $(R2/(R1+R2))*VCC_f$.

An operational amplifier 13 has its power supply terminals coupled to terminals 1 and 3. An input terminal of amplifier 13, here the inverting input (−), is coupled to output terminal 6 of filter 5. A MOS transistor 15 and a resistor 17 of value R3 are series-connected between terminals 1 and 3, the control terminal of transistor 15 being coupled to the output of amplifier 13. Resistor 17 couples the drain of transistor 15 and the other input of amplifier 13, here, the non-inverting input (+), to terminal 3. Thus, a voltage of value V0 is imposed across resistor 17, whereby a current I0 varying proportionally to voltage V0 flows through resistor 17 and transistor 15. In this example, current I0 is substantially equal to $(R2/(R1+R2))*(VCC_f/R3)$. A MOS transistor 19 is series-connected with a MOS transistor 21, between terminals 1 and 3, a control terminal of transistor 19 being coupled to the control terminal of transistor 15. Due to the fact that transistors 15 and 19 are both controlled by the output of amplifier 13, a current I1 proportional to current I0 flows through transistor 19, and thus through transistor 21. In this example, transistors 15 and 19 have a same dimension ratio W/L (W and L being respectively the width and the length of the gate) and current I1 is equal to current I0. Thus, amplifier 13, resistor 17, and transistors 15 and 19 form a control circuit 23 of transistor 21, control circuit 23 supplying transistor 21 with a current I1 varying proportionally to voltage V0.

The detection circuit further comprises a MOS transistor 25 mirror-assembled with a MOS transistor 27 having its source coupled to terminal 1. The drain of transistor 27 is coupled to the drain of a MOS transistor 29, mirror-assembled with transistor 21. The drain of transistor 25 is coupled to the drain of a transistor 31, mirror-assembled with transistor 21. The sources of transistors 29 and 31 are coupled to terminal 3. Due to the fact that transistors 29 and 31 are mirror-assembled with transistor 21, transistor 29 supplies a current Iref1 proportional to current I1, and transistor 31 tends to supply a current Iref2 proportional to current I1. In this example, transistors 29 and 31 have a same dimension ratio W/L, and currents Iref1 and Iref2 are substantially equal. A capacitor 33 of value C2 couples the gate of transistor 25 and the gate of transistor 27 to terminal 3. A resistor 35 of value R4 couples the source of transistor 25 to terminal 1. An output terminal OUT1 of the circuit is connected to the drain of transistor 25.

In operation, voltage Vgs27 between the gate and the source of diode-assembled transistor 27 is imposed by current Iref1 supplied by transistor 29. In order for current I25 in transistor 25 to be equal to current Iref2 which tends to be delivered by transistor 31, which is in this example equal to Iref1, voltage Vgs25 between the gate and the source of transistor 25 is equal to Vgs27.

In the absence of glitch, this is not possible due to the voltage drop equal to R4*Iref2 which would then occur in resistor 35. Transistor 25 is thus off. As a result, output OUT1 is at a value capable of being interpreted as a first logic state, for example, the low state, indicating the absence of a glitch.

During a positive glitch of voltage VCC, the potential increase of terminal 1 resulting from this glitch can be observed on the source of transistor 25. Further, transistor 27 is equivalent, as a first approximation in small signal model, to the inverse of its conductance gm, that is, to a resistor of value R5. Resistor R5 and capacitor 33 form a low-pass filter having its cut-off frequency $1/(2\pi R5C2)$ determining the minimum frequency of the glitches detectable by the circuit.

If the glitch frequency is smaller than cut-off frequency $1/(2\pi R5C2)$ of the filter, the potential increase of terminal 1 can be observed on the gate of transistor 25. Voltage Vgs25 does not change and keeps the same value as in the absence of a glitch. Output OUT1 remains in the first logic state indicating the absence of a glitch.

If the glitch frequency is greater than cut-off frequency $1/(2\pi R5C2)$ of the filter, the potential increase of terminal 1 cannot be observed on the gate of transistor 25, whereby voltage Vgs25 increases. As long as the amplitude of the glitch is smaller than R4*Iref2, the increase of voltage Vgs25 is not sufficient to compensate for voltage drop R4*Iref2 in resistor 35 and output OUT1 remains in the first logic state. However, if the amplitude of the glitch is greater than R4*Iref2, the increase of voltage Vgs25 is sufficient to compensate for voltage drop R4*Iref2 in resistor 35. Transistor 25 is then conductive and output OUT1 changes value, which may be interpreted as a switching from the first logic state to a second logic state, for example, the high logic state, indicating the detection of a glitch.

A circuit for detecting positive glitches of voltage VCC where the detection threshold is equal to R4*Iref2 is thus obtained. Due to the fact that current Iref2 supplied by transistor 31 varies proportionally to voltage V0, the threshold varies proportionally to voltage V0 and is thus a function of voltage VCC. More particularly, the detection threshold is here equal to $\alpha*VCC_f$, $\alpha$ being a proportionality factor. In the example described herein, current Iref2 is equal to k times current I1, and thus to k times current I0, and factor $\alpha$ is then equal to $R2*k*R4/((R1+R2)*R3)$, the value of factor $\alpha$ being selected by appropriately setting values k, R1, R2, R4, and R3.

An advantage of the circuit of FIG. 1 is that its detection threshold remains substantially equal to a same factor of voltage VCC, whatever the value of voltage VCC, this factor being determined by proportionality factor $\alpha$. Advantage is here taken from the fact that the detection threshold is proportional to voltage V0 obtained by low-pass filtering of voltage VCC.

As an example, for $\alpha$=0.1, if voltage VCC is equal to 1.62 V, voltage $VCC_f$ is substantially equal to 1.62 V, whereby the detection threshold is substantially equal to 0.162 V, and thus to 0.1*VCC. If voltage VCC is equal to 5.5 V, voltage $VCC_f$ is equal to 5.5 V, whereby the detection threshold is substantially equal to 0.55 V, and thus to 0.1*VCC.

As an example, voltage VCC is a power supply voltage, for example, of an electronic circuit comprising the detection circuit of FIG. 1, and has a value for example in the range from 1.62 to 5.5 V.

An alternative embodiment provides an additional resistor connected between the gate of transistor 27 and the terminal of capacitor 33 connected to the gate of transistor 25. The value of this additional resistor provides an additional parameter to set the cut-off frequency of the low-pass filter comprising capacitor 33 and resistor R5 of transistor 27.

Another alternative embodiment provides an additional capacitor in parallel with resistor 35 and/or an additional capacitor between the source and the gate of transistor 27. This results in improving the detection of positive disturbances having high frequencies, for example, greater than 100 MHz.

Another alternative embodiment comprises providing a same proportionality factor between the dimension ratio W/L of transistor 27 and that of transistor 25 and between the dimension ratio W/L of transistor 29 and that of transistor 31, this factor for example being selected to minimize the power consumption in the branch comprising transistors 27 and 29. More generally, the current ratios between two branches of the circuit may be modified by adapting the W/L ratios of the transistors of these branches, for example, to minimize the power consumption in the circuit.

Another alternative embodiment comprises using bipolar transistors rather than MOS transistors. Similarly, the current ratios may be varied by having different emitter surface area ratios between two branches.

Another alternative embodiment provides that at least one of resistors 7, 9, 17, and 35 is settable to be able to adapt, for example during a calibration phase, proportionality factor $\alpha$, and thus the detection threshold.

Each of the above variations may be combined with one or a plurality of other ones of these variations.

Figure 2:
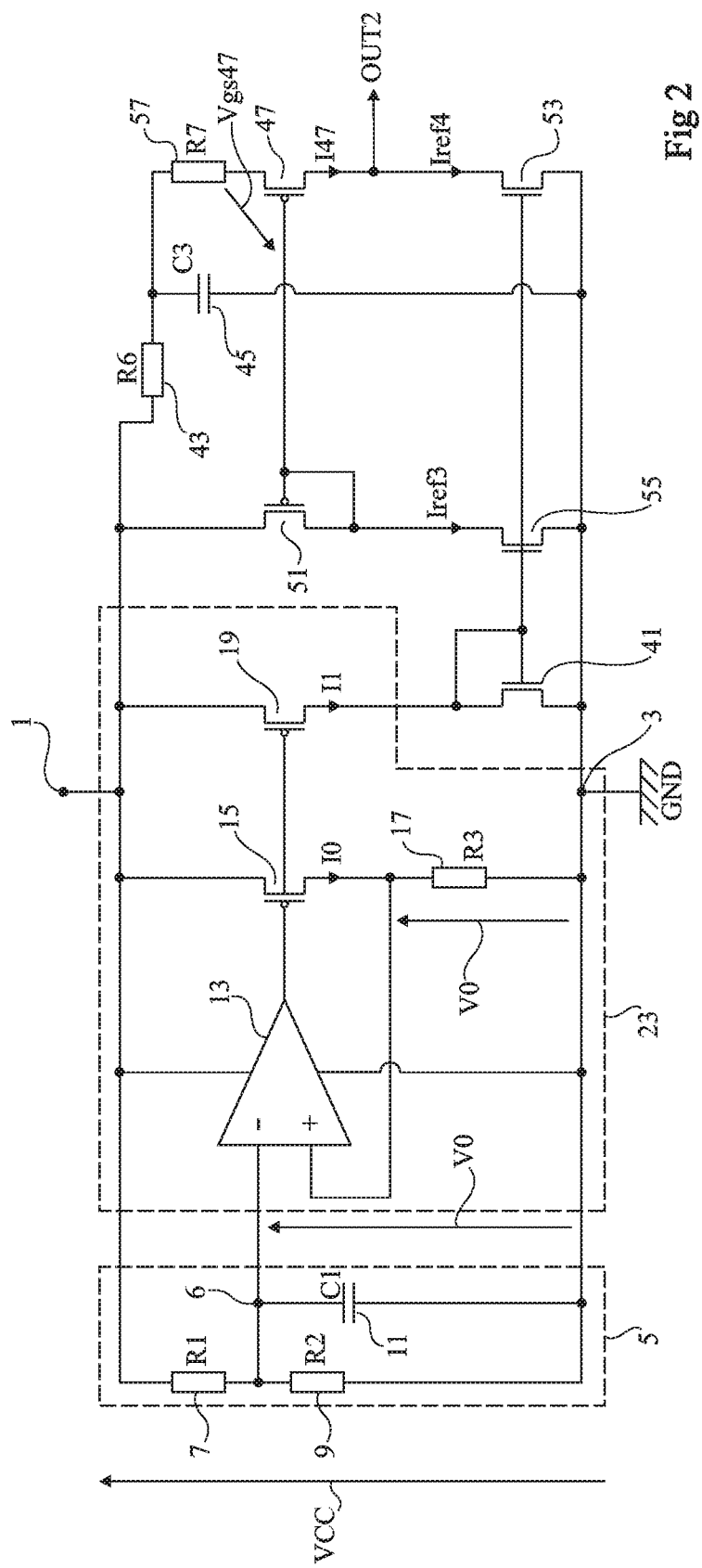
FIG. 2 shows an embodiment of a circuit for detecting negative glitches of a DC voltage.

FIG. 2 shows an embodiment of a circuit for detecting a negative glitch of a DC voltage.

The circuit of FIG. 2 comprises filter 5 and control circuit 23, connected together and to terminals 1 and 3 in the same way as in FIG. 1. Similarly to the circuit of FIG. 1, transistor 19 is series-connected with a MOS transistor 41, between terminals 1 and 3, the drain of transistor 19 being coupled to the drain of MOS transistor 41 having its source coupled to terminal 3. Control circuit 23 thus supplies current I1 to transistor 41, based on output voltage V0 of filter 5. The detection circuit further comprises a resistor 43 of value R6 and a capacitor 45 of value C3, series-connected between terminals 1 and 3. A MOS transistor 47 is mirror-assembled with a MOS transistor 51 having its source coupled to terminal 1. The drain of transistor 47 is coupled to the drain of a MOS transistor 53, mirror-assembled with transistor 41. The drain of transistor 51 is coupled to the drain of a MOS transistor 55, mirror-assembled with transistor 41. The sources of transistors 53 and 55 are coupled to terminal 3. Similarly to what has been described for the circuit of FIG. 1, due to the fact that transistors 53 and 55 are mirror-assembled with transistor 41, transistor 55 supplies a current Iref3 proportional to current I1, and transistor 53 tends to supply a current Iref4 proportional to current I1. In this example, transistors 53 and 55 have a same dimension ratio W/L, and currents Iref3 and Iref4 are substantially equal. The source of transistor 47 is coupled to a terminal of a resistor 57 of value R7, the other terminal of this resistor being coupled to the junction point of resistor 43 and of capacitor 45. An output terminal OUT2 of the circuit is connected at the level of the drain of transistor 47.

In the circuit of FIG. 2, resistor 43 and capacitor 45 form a low-pass filter having a cut-off frequency $1/(2\pi R6C3)$ which determines the minimum frequency of the glitch detectable by the circuit.

The operation of this circuit is similar to that of FIG. 1 with the difference that during a glitch of voltage VCC, the glitch is now followed by the gate of the current mirror comprising transistors 47 and 51 rather than by the source, which is then common. Indeed, during a negative glitch of voltage VCC, the potential of terminal 1 decreases and this decrease is propagated on the gate of transistor 51, and thus on the gate of transistor 47.

If the glitch frequency is smaller than cut-off frequency $1/(2\pi R6C3)$ of the filter, the potential decrease of terminal 1 can be observed on the source of transistor 47, but this does not induce a change in voltage Vgs47 between the gate and the source of transistor 47 due to the fact that this potential decrease can also be observed on the gate of transistor 47. Voltage Vgs47 keeps the same value as in the absence of a glitch and is not sufficient to compensate for the voltage drop equal to R7*Iref4 which would occur in resistor 57 if transistor 47 was conductive. As a result, transistor 47 is non-conductive and output OUT2 is in the first logic state indicating the absence of a glitch.

However, if the frequency of the glitch is greater than cut-off frequency $1/(2\pi R6C3)$ of the filter, due to the action of the low-pass filter, the potential decrease of terminal 1 cannot be observed on the source of transistor 47 while it is propagated on its gate. This results in a change in voltage Vgs47. From the moment when the amplitude of the glitch is greater than or equal to R7*Iref4, voltage Vgs47 is sufficient for transistor 47 to be conductive. As a result, the output switches from the first logic state to the second logic state, which indicates the detection of a glitch.

A circuit for detecting negative glitches of voltage VCC where the detection threshold is equal to R7*Iref4 is thus obtained. Due to the fact that current Iref4 supplied by transistor 53 varies proportionally to voltage V0, the threshold varies proportionally to voltage V0 and is thus a function of voltage VCC. More particularly, the detection threshold is equal to $\beta*VCC_f$, $\beta$ being a proportionality factor, for example, equal to 0.1. In the example described herein, current Iref4 is equal to z times current I1, and thus to z times current I0, and factor $\beta$ is then equal to (R2*z*R7/(R1+R2)*R3), the value of factor $\beta$ being selected by appropriately setting values z, R1, R2, R3, and R7.

The circuit of FIG. 2 benefits from the same advantages as the circuit of FIG. 1. Further, the variations described for the circuit of FIG. 1, as well as their different combinations, can be transposed to the circuit of FIG. 2.

An embodiment, not shown, provides a circuit or device for detecting negative and positive glitches of a DC voltage. This device comprises the circuit of FIG. 1. This device further comprises transistors 47, 51, 53, and 55, resistors 43 and 57, and capacitor 45 of the circuit of FIG. 2, connected together and to terminals 1 and 3 in the same way as in FIG. 2. However, conversely to the circuit of FIG. 2, in this device, transistors 53 and 55 are mirror-assembled with transistor 21 of the circuit of FIG. 1.

A circuit for detecting positive and negative glitches of a same DC voltage VCC by providing a single filter 5 and a single control circuit 23 is thus obtained. As previously, the positive and negative glitch detection thresholds vary proportionally to voltage V0, obtained by low-pass filtering of voltage VCC, and thus depend on the value of this voltage VCC.

The advantages of the circuits of FIGS. 1 and 2 are still obtained in this embodiment. Further, the variations described for the circuits of FIGS. 1 and 2, as well as their different combinations, can be transposed to this embodiment.

In a preferred embodiment of the above-described detection circuits, term coupled means directly connected, as shown in the corresponding drawings.

Specific embodiments have been described. Various alterations, modifications and improvements will readily occur to those skilled in the art. In particular, term "capacitor" should be understood as more generally meaning "capacitive element" and term "resistor" should be understood as more generally meaning "resistive element".

Operational amplifier 13 may comprise an inner device filtering the glitch of the voltage applied between its power supply terminals, which enables to avoid for glitches of the VCC voltage to have a direct influence on the output potential of the amplifier. A (LDO—"Low Drop Out") voltage regulator may also be provided to supply the power supply voltage of amplifier 13 from voltage VCC.

The conversion circuitry connected at the level of each of the output terminals of the above-described circuits to provide a logic equivalent 1 or 0 according to whether a glitch is detected or not has not been described, it being within the abilities of those skilled in the art to design such a circuitry. An example of such a circuitry comprises a first inverter having its input terminal connected to an output terminal of one of the previously-described circuits, and a second inverter having its input terminal connected to the output terminal of the first inverter, the first and second inverters being for example powered with an output voltage of a voltage regulator (LDO).

Figure 3:
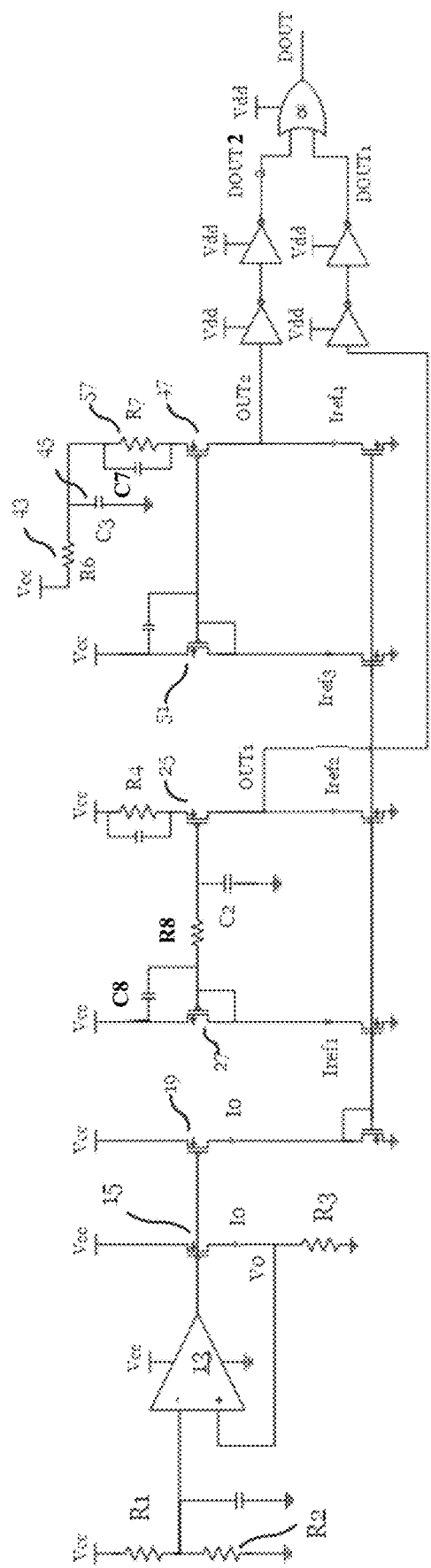
FIG. 3 shows an embodiment of a circuit for detecting positive and negative glitches of a DC voltage.

FIG. 3 shows an embodiment of a circuit for detecting positive and negative glitches of a DC voltage.

In one or more embodiments, the embodiments described in FIG. 1 and FIG. 2 may be combined together as illustrated in FIG. 3, which also shows the conversion circuitry mentioned above to generate a digital output (DOUT1 and DOUT2). An additional logic OR gate may be used to achieve a common digital output (DOUT) that indicates the occurrence of a glitch.

Various embodiments with various variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for detecting a glitch in power supply, the circuit comprising:
    a detection circuit configured to detect the glitch in a DC supply voltage of the power supply when a magnitude in the glitch in a DC supply voltage of the power supply exceeds a detection threshold, wherein the detection threshold is a function of the DC supply voltage, wherein the detection circuit comprises a control circuit configured for providing a current proportional to a filtered voltage obtained by low-pass filtering of the DC supply voltage; and
    a current mirror circuit coupled to and distinct from the control circuit, the current mirror circuit having an output configured for providing a logic signal indicative of a detected glitch.

2. The circuit of claim 1, wherein the detection threshold varies proportionally to the filtered voltage obtained by low-pass filtering of the DC supply voltage.

3. The circuit of claim 2, wherein a first current varying linearly proportionally to the filtered voltage obtained by filtering conditions the detection threshold.

4. The circuit of claim 3, further comprising a low-pass filter configured to supply the filtered voltage coupled between a first terminal and a second terminal of the power supply providing the DC supply voltage.

5. A circuit for detecting a glitch in power supply, the circuit comprising:
    a first low-pass filter configured to supply a filtered voltage coupled between a first terminal and a second terminal of the power supply providing a DC supply voltage;
    a detection circuit coupled to the first low-pass filter and configured to detect the glitch in the DC supply voltage when an amplitude in the glitch in a DC supply voltage of the power supply exceeds a detection threshold proportionally varying with the filtered voltage, wherein the detection circuit comprises:
    a first branch comprising a first transistor and a first current source; and
    a second branch comprising a first resistor, a second transistor mirror-assembled with the first transistor, and a second current source supplying a first current varying proportionally to the filtered voltage.

6. The circuit of claim 5, further comprising:
    a third transistor, the second current source comprising a fourth transistor mirror-assembled with the third transistor; and
    a control circuit configured to supply the third transistor with a second current varying proportionally to the filtered voltage.

7. The circuit of claim 6, wherein the first current source comprises a fifth transistor mirror-assembled with the third transistor.

8. The circuit of claim 6, wherein the control circuit comprises a second resistor and is further configured to impose the filtered voltage across the second resistor, the second current varying proportionally to a third current running through the second resistor.

9. The circuit of claim 8, wherein the control circuit comprises:
    a sixth transistor series-connected with the third transistor between the first terminal and the second terminal; and
    a seventh transistor in series with the second resistor between the first terminal and the second terminal, a control terminal of the seventh transistor being coupled to a control terminal of the sixth transistor.

10. The circuit of claim 9, wherein the control circuit comprises an operational amplifier having a first input connected to an output of the first low-pass filter, having a second input connected to the junction point of the seventh transistor and of the second resistor, and having an output connected to the control terminals of the sixth and seventh transistors.

11. The circuit of claim 10, wherein the first input of the amplifier is the inverting input and the second input of the amplifier is the non-inverting input.

12. The circuit of claim 5, further comprising a second low-pass filter connected to a control terminal of each of the first and second transistors.

13. The circuit of claim 5, further comprising a second low-pass filter coupling the first terminal to the first resistor.

14. The circuit of claim 13, wherein the second low-pass filter comprises an additional capacitor in parallel with the first resistor and a second resistor in series with the additional capacitor and the first resistor.

15. The circuit of claim 13, wherein the second low-pass filter determines a minimum frequency of the glitch that is detectable by the circuit.

16. The circuit of claim 13, wherein the second transistor is configured to change from a first conductive state to a second conductive state for a negative glitch when a frequency of the glitch is greater than a cut-off frequency of the second low-pass filter and the amplitude of the glitch is greater than the detection threshold.

17. The circuit of claim 5, wherein the second transistor is configured to change from a first conductive state to a second conductive state for a positive glitch when a frequency of the glitch is greater than a cut-off frequency of the first low-pass filter and the amplitude of the glitch is greater than the detection threshold.

18. The circuit of claim 5, further comprising an additional resistor coupled between a gate of the first transistor and a gate of the second transistor.

19. The circuit of claim 5, further comprising an additional capacitor between a gate and a source of the first transistor.

20. The circuit of claim 5, wherein the first transistor and the second transistor are MOS transistors or bipolar transistors.

21. The circuit of claim 5, wherein the circuit is configured to detect the glitch across an entire power supply range comprising 1.62V to 5.5V.

22. A method of detecting a glitch in power supply, the method comprising:
  detecting the glitch in a DC supply voltage across an entire power supply range using a detection circuit by setting a detection threshold that depends on the DC supply voltage; and
  identifying a glitch when a magnitude in the glitch in the DC supply voltage of the power supply exceeds the detection threshold; and
  at a first low-pass filter, filtering the DC supply voltage to generate a filtered voltage, wherein the detection threshold proportionally varies with the filtered voltage;
  having a detection circuit coupled to the first low-pass filter, the detection circuit comprising a control circuit and a current mirror circuit coupled to and distinct from the control circuit including:
    a first branch comprising a first transistor and a first current source; and
    a second branch comprising a first resistor, a second transistor mirror-assembled with the first transistor, and a second current source supplying a first current varying proportionally to the filtered voltage.

23. The method of claim 22, further comprising:
  having a second low-pass filter coupled to the first resistor; and
  in response to a negative glitch, changing a state of the second transistor from a first conductive state to a second conductive state when a frequency of the glitch is greater than a cut-off frequency of the second low-pass filter and the amplitude of the glitch is greater than the detection threshold.

24. The method of claim 22, in response to a positive glitch, changing a state of the second transistor from a first conductive state to a second conductive state when a frequency of the glitch is greater than a cut-off frequency of the first low-pass filter and the amplitude of the glitch is greater than the detection threshold.

* * * * *